(12) United States Patent
Hu

(10) Patent No.: US 8,446,497 B2
(45) Date of Patent: May 21, 2013

(54) MULTI-SPECTRUM SENSING DEVICE AND MANUFACTURING METHODS THEREOF

(75) Inventor: Xiaoping Hu, Shenzhen (CN)

(73) Assignee: Boly Media Communications (Shenzhen) Co., Ltd., Shenzhen (CN)

( * ) Notice: Subject to any disclaimer, the term of this patent is extended or adjusted under 35 U.S.C. 154(b) by 650 days.

(21) Appl. No.: 12/684,555

(22) Filed: Jan. 8, 2010

(65) Prior Publication Data
US 2010/0141771 A1 Jun. 10, 2010

Related U.S. Application Data

(63) Continuation-in-part of application No. PCT/CN2007/071262, filed on Dec. 18, 2007.

(51) Int. Cl.
*H04N 5/335* (2011.01)

(52) U.S. Cl.
USPC .......................................... 348/272; 348/273

(58) Field of Classification Search .................. 348/272, 348/273
See application file for complete search history.

(56) References Cited

U.S. PATENT DOCUMENTS

| | | | | |
|---|---|---|---|---|
| 4,514,755 | A | * | 4/1985 | Tabei ............................. 348/280 |
| 4,613,895 | A | * | 9/1986 | Burkey et al. ................. 348/272 |
| 4,651,001 | A | * | 3/1987 | Harada et al. ................. 250/330 |
| 6,198,147 | B1 | | 3/2001 | Connolly |
| 2005/0205958 | A1 | | 9/2005 | Taniguchi et al. |

FOREIGN PATENT DOCUMENTS

JP 2006228939 3/2006

\* cited by examiner

*Primary Examiner* — Sath V Perungavoor
*Assistant Examiner* — Jeffery Williams
(74) *Attorney, Agent, or Firm* — Lathrop & Gage LLP

(57) ABSTRACT

A multi-spectrum sensing device comprises a top layer and a bottom layer. The top layer comprises sensing pixels for sensing a first group of colors. The bottom layer comprises sensing pixels for sensing a second group of colors. At least one of the layers comprises sensing pixels having at least two or more than two spectra.

17 Claims, 13 Drawing Sheets

| Cyan | Yellow | Cyan | Yellow | Cyan | Yellow | | | | | | |
|---|---|---|---|---|---|---|---|---|---|---|---|
| Peach | Green | Peach | Green | Peach | Green | | | | | | |
| Cyan | Yellow | Cyan | Yellow | Cyan | Yellow | | | | | | |
| Peach | Green | Peach | Green | Peach | Green | | | | | | |
| Cyan | Yellow | Cyan | Yellow | Cyan | Yellow | | | | | | |
| Peach | Green | Peach | Green | Peach | Green | | | | | | |
| | | | | | | | | | | | |
| | | | | | | | | | | | |
| | | | | | | | | | | | |
| | | | | | | | | | | | |
| | | | | | | | | | | | |
| | | | | | | | | | | | |

FIG. 1

| Green | Red | Green | Red |
|---|---|---|---|
| Blue | Green | Blue | Green |
| Green | Red | Green | Red |
| Blue | Green | Blue | Green |

FIG. 2(A)

| Green | Blue | Green | Blue |
|---|---|---|---|
| Red | Green | Red | Green |
| Green | Blue | Green | Blue |
| Red | Green | Red | Green |

FIG. 2(B)

| Blue | Green | Blue | Green |
|---|---|---|---|
| Green | Red | Green | Red |
| Blue | Green | Blue | Green |
| Green | Red | Green | Red |

FIG. 2(C)

| Red | Green | Red | Green |
|---|---|---|---|
| Green | Blue | Green | Blue |
| Red | Green | Red | Green |
| Green | Blue | Green | Blue |

FIG. 2(D)

| White | Blue  | White | Green |
|-------|-------|-------|-------|
| Blue  | White | Green | White |
| White | Green | White | Red   |
| Green | White | Red   | White |

| Green | White | Red   | White |
|-------|-------|-------|-------|
| Green | White | Red   | White |
| Blue  | White | Green | White |
| Blue  | White | Green | White |

| Green | White | Red   | White |
|-------|-------|-------|-------|
| Blue  | White | Green | White |
| Green | White | Red   | White |
| Blue  | White | Green | White |

| White | Infrared | White | Infrared |
|---|---|---|---|
| Infrared | White | Infrared | White |
| White | Infrared | White | Infrared |
| Infrared | White | Infrared | White |
FIG. 11(A)
| White | White+Infrared | White | White+infrared |
|---|---|---|---|
| White+Infrared | White | White+Infrared | White |
| White | White+Infrared | White | White+Infrared |
| White+Infrared | White | White+Infrared | White |
FIG. 11(B)
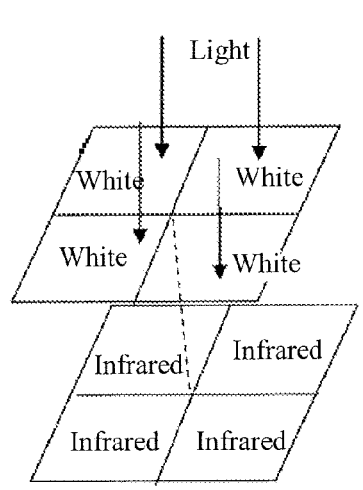
FIG. 12(A)
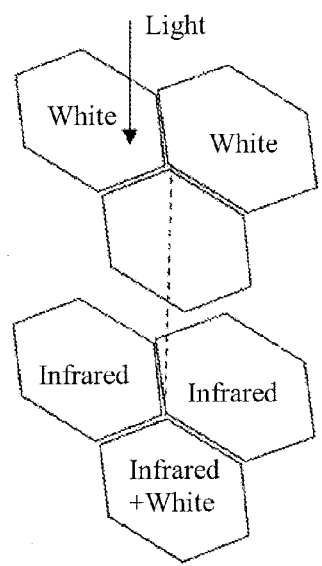
FIG. 12(B)

MULTI-SPECTRUM SENSING DEVICE AND MANUFACTURING METHODS THEREOF

CROSS REFERENCE OF RELATED APPLICATIONS

This application is a continuation in part of PCT Application No. PCT/CN2007/071262, which claims benefit of Chinese application No. 200710075992.4 filed on Jul. 9, 2007, all of which are incorporated herein by reference in their entirety.

FIELD OF THE INVENTION

The present invention relates to an image sensing device and a method for manufacturing the same, especially to an image sensing device for converting light into electronic signal arrays and a method for manufacturing the same. More particularly, the present invention relates to a new panchromatic image sensing device for simultaneously sensing several spectra (such as visible light and infrared) and its manufacturing method. Herein, the panchromatic spectrum (or color) comprises the entire spectra of interest. For normal sensing devices (e.g., those for visible light), the panchromatic comprises entire spectra of visible light that contains red, green, blue and white. For sensing devices used for a combination of infrared and visible light, the panchromatic comprises spectra of visible light and infrared. The invention applies to multi-spectrum sensing devices for sensing monochrome and color images.

BACKGROUND OF THE INVENTION

The traditional technology for designing and manufacturing color image sensing devices has had a few technical difficulties and limitations. More particularly, color image sensors in the prior art have problems of low sensitivity, low pixel resolution, and color aliasing. Generally, an image sensor today can only sense either black and white images or color images. At present, there are only few methods in practice for making color image sensors capable of producing color images from single sensing pixel arrays. The most common method of making color image sensors is to coat a color filter pattern on sensing pixel arrays. Two color filter patterns are mainly used in a traditional color image sensor chip. FIG. 1 illustrates a color filter pattern, namely a CYMG (M for pink or Magenta) pattern (also called composite color filter pattern), which comprises cyan, yellow, magenta and green colors. FIGS. 2(a), 2(b), 2(c) and 2(d) and FIGS. 3(a) and 3(b) illustrate some primary color (RGB) filter patterns ordered as a Bayer pattern or a honeycomb pattern, respectively. Both of these two patterns sense red, green and blue colors.

In the color image sensors of CYMG pattern, the pixel array comprises many macro-pixels. Each macro-pixel comprises four pixels, each being coated by C, Y, M or G color filter, respectively. However, it is primary colors (namely RGB) pattern not CYMG pattern that is used in the display industry, and thus it is necessary to transform a color matrix for C, Y, M or G color to a matrix for RGB so as to convert CYMG pattern into RGB pattern. Furthermore, because each pixel senses only one color (either cyan, or yellow, or magenta, or green), to sense RGB colors by each pixel, interpolation technique is needed to interpolate the missed colors from the adjacent pixels. In Bayer pattern (U.S. Pat. No. 3,971,065), the sensing pixel array comprises many macro-pixels, each comprising four pixels coated with only RGB colors. Bayer pattern further requires that in every macro-pixel, two elements at one of the diagonals must sense green or a color corresponding to luminance of the image, whereas the other two colors sensed are red and blue, or colors corresponding to two other different spectra of visible light. Similarly, because each pixel senses only one type of color (red, or green, or blue), to sense the other two missed colors at the pixels, interpolation is needed to interpolate the missed colors from the adjacent pixels. Bayer pattern has four different orderings, each representing a certain arrangement of the RGB position. In a honeycomb pattern as shown in FIG. 3, a macro-pixel comprises only three pixels coated by RGB colors and arranged in a honeycomb form. In the honeycomb pattern, pixels sensing RGB colors are arranged uniformly and symmetrically; and exchanging the position of two pixels still yields a honeycomb pattern.

As described above, there are three common issues in implementing the color filters formed by a composite (CYMG) pattern, Bayer pattern or honeycomb pattern: firstly reducing light-sensing sensitivity due to the existence of the color filters (compared with the monochrome sensors); secondly, reducing effective spatial definition (or resolution) due to color interpolation, which in turn causes the third one, color aliasing. Normally, the color aliasing may be solved by using low-pass filters. However, low-pass filters will reduce the image definition, thereby worsening the second issue.

To avoid the reduction of the light sensitivity caused by the color filters, U.S. Pat. No. 6,137,100 discloses a method for balancing the sensing response of RGB pixels, which makes use of the characteristic of photodiodes that have different sensitivities for different colors. Specifically, a photodiode is more sensitive to green, secondly red, and then blue. Therefore, areas sensitive to blue are made biggest, then to red and smallest to green. The improvement on color sensitivity with this method is still limited. Moreover this method just emphasizes the RGB color pattern.

Recently, Kodak Company launched a method that combines white and RGB colors, namely adding a white sensing pixel to the RGB pixel array to increase the sensitivity. As shown in FIGS. 4(a), 4(b) and 4(c), as the white pixel absorbs several times more light energy than primary color (red, green or blue) pixels or the complementary color (cyan, yellow or magenta) pixels, the WRGB (white and RGB colors) method is certainly 2-3 times more sensitive than the sensors used in the traditional Bayer pattern. However, this method brings new problems. Firstly, the color reconstruction is more complicated. Secondly, as a result of changing three colors to four colors, the spatial resolution is reduced compared to Bayer pattern. Lastly, because the sensitivity of the white color is 6-10 times more than the other three RGB colors, the signal strengths of different colors are strongly mismatched, which limits the advantage of the high sensitivity of the white color, as the color with the lowest sensitivity determines the quality of an image.

In order to avoid color interpolation, Foveon Company of USA invented a new color sensing technology that uses three layers of sensing pixels, as shown in FIG. 5. A three-layer color image sensor, called "X3 image sensor", has three layers of sensing arrays, each being sensitive to one light spectrum of the RGB colors, respectively. The X3 image sensor can solve the problem of color interpolation, but it brings out new problems due to the sensitivity differences of different sensing layers. The sensing sensitivity of a lower layer is usually lower than an upper layer of the three layers. Thus, the total effective sensitivity is reduced. In addition, the cost and complexity will be increased due to the manufacturing of the three layers. Furthermore, three times more data to be transmitted and processed significantly increase the system cost and power consumption of the X3 image sensor.

Color image sensors generally respond to the continuous spectrum of RGB color. There are also monochrome image sensors that are sensitive to the entire visible spectrum, or the infrared spectrum, or both of them. The sensitivity of this kind of monochrome sensor is generally 10 times more than the sensitivity of the traditional Bayer pattern image sensors (under the same physical condition of production), but such a sensor cannot produce color.

As mentioned previously, although many improvements on color sensing devices have been made in the prior art, each just has been improved in one or more aspects while lowering the performance of others. Single layer image sensors do not maximize use of the light energy while reducing the spatial resolution. Three-layer sensors fail to use the white color and the complementary colors, reducing sensitivity. In addition, manufacturing the three-layer sensors is overly complicated.

Hence, it is still necessary to improve the prior art to find out a sensing device and a manufacturing method thereof, which may combine the advantages of monochrome image sensors and color image sensors to solve the technical issues in the art as stated above.

SUMMARY OF THE INVENTION

In view of the technical issues in the prior art, the present invention provides an image sensing device and a method for manufacturing the same, which may overcome problems caused by color interpolation, maximize the use of light energy, and increase the spatial resolution and sensitivity of light.

To this end, a two-layer image sensing device and its manufacturing method are provided, which may increase the production yield, simplify the structure, decrease data to be transmitted and processed, and reduce the cost and power consumption.

In view of the above, a multi-spectrum sensing device according to one embodiment of the present invention comprises: at least a top layer and a bottom layer, wherein the top layer comprises sensing pixels for sensing a first group of colors, the bottom layer comprises sensing pixels for sensing a second group of colors, and at least one layer comprises sensing pixels for sensing at least two or more spectra.

Preferably, the multi-spectrum sensing device consists of one top layer and one bottom layer.

The spectra comprise a spectrum of blue, green, red and infrared light.

The first group of colors comprises one of the following:
A. at most four kinds of colors selected from blank color, blue, green and cyan;
B. blank color or blue;
C. blank color, blue and cyan;
D. blank color, blue and green;
E. blank color, green and cyan; and
F. blank color, blue, green and cyan.

Further, the wavelength of a color sensed in a lower layer is longer than the wavelength of a color sensed at a corresponding position in a layer that is upper to the lower layer. A spectrum of each color sensed in the lower layer is orthogonal to total spectra of colors sensed at corresponding positions in all layers upper to the lower layer within a color space of visible light, and a spectrum of each color sensed in the bottom layer is orthogonal to a spectrum of each color sensed at a corresponding position in a layer upper to the bottom payer either within the spectral space of visible light or a composite spectral space of visible light and infrared light. The definition of the term "orthogonal" will be given in the description of the embodiments below.

Furthermore, the spectrum of each color sensed in a lower layer is complementary to total spectrum of colors at corresponding positions in all layers upper to the lower layer within a spectral space of visible light. The definition of the term "complementary" will be given in the description of the embodiments below.

Further, the second group of colors sensed in the bottom layer comprise at most four colors selected from green, red, yellow, white, infrared, red plus infrared, yellow plus infrared and white plus infrared.

The pixels sensing colors are disposed in a uniform pattern, horizontal pattern, vertical pattern, diagonal pattern, generalized Bayer pattern, YUV422 pattern, horizontal YUV422 pattern, honeycomb pattern or equal-spacing pattern. The mentioned patterns will be described below in the embodiments.

The top layer may include a first group of sensing pixels sensing intensity of visible light (white color), and the bottom layer may include a second group of sensing pixels sensing intensity of infrared and visible light (white+infrared). This approach is normally used in monochrome sensing devices.

Provided also is a method for making a multi-spectrum sensing device, comprising:
  providing a top layer and a bottom layer,
  wherein the top layer comprises sensing pixels for sensing a first group of colors, the bottom layer comprises sensing pixels for sensing a second group of colors, and at least one layer comprises sensing pixels for sensing at least two color spectra.

Preferably, only the top layer and the bottom layer are provided without any other middle layers. The spectra comprise the spectrum of blue, green, red and infrared color.

Furthermore, the first group of colors the top layer senses comprise one of the following:
A. at most four kinds of colors selected from blank color, blue, green and cyan;
B. blank color or blue;
C. blank color, blue and cyan;
D. blank color, blue and green;
E. blank color, green and cyan; and
F. blank color, blue, green and cyan.

Furthermore, the wavelength of a color sensed in each layer except the top layer is longer than the wavelength of a color sensed at a corresponding position in a layer upper to the each layer.

Further, the spectrum of each color sensed in a lower layer is provided orthogonal to the total spectra of colors sensed at corresponding positions within a spectral space of visible light, and the spectrum of each color sensed in the bottom layer is provided orthogonal to the spectrum of each color sensed at a corresponding position in a layer upper to the bottom either within a spectral space of visible light or a composite spectral space of visible light and infrared light, and preferably they are complementary within a spectral space of visible light.

The method may further comprise providing a layer line for delaminating the sensing pixels, such that colors sensed in an upper layer are above the layer liner and colors sensed in a lower layer is below the layer line (which will be described in detail later in the embodiments in conjunction with FIG. 6(b)). The layer line may be a color separation line between blue and green, or between green and red, or between red and infrared; or a boundary line of maximum wavelength of interest within infrared light.

Further more, the present invention also includes only one layer comprising just sensing pixels sensing two spectra, that are placed in a horizontal pattern, vertical pattern or diagonal pattern, whereas other layers are blank or comprise no sensing pixels. In this way, we can obtain a (degenerated) single layer sensing device (mainly used for monochrome image sensors).

With the above described device and method, the following advantages may be obtained.

1. The multi-spectrum sensing device designed to have at least two layers, wherein at least one layer comprises sensing pixels for sensing at least two color spectra, firstly can sense a plurality of spectra at the same time to avoid color interpolation, which obtains the same, higher, or even theoretically the highest spatial resolution compared with the Bayer pattern (or any other patterns); secondly can make maximum use of, with different layers, the incident light energy in all spectral regions so to obtain the maximum efficiency of light utilization and the maximum sensitivity; and thirdly can sense more than three colors such that a larger color representation gamut is obtained in addition to full color reconstruction.
2. Especially, with a two-layer (top layer and bottom layer) structure of a multi-spectrum sensing device, energy of the incident light (to enhance the signal) is used maximally at a lower cost, while electronic noise signals produced during the photon-to-heat conversion can be reduced. Furthermore, in the manufacturing, the production efficiency will be increased, and data to be processed and transmitted will be decreased, and the cost and the power consumption of the device will be reduced.
3. The present invention makes an optimal ordering of different sensing pixels in the respective layers, such that a color in the bottom layer is orthogonal to the color at the corresponding position in the top layer. The wavelength of lights sensed by the sensing pixels in the bottom layer is longer than the wavelength of lights sensed by the sensing pixels at the corresponding position in the top layer, and the spectrum sensed by the sensing pixels in the bottom layer is not included in that sensed by the sensing pixels in the top layer at the corresponding position (otherwise the pixels in the bottom layer cannot obtain photons of the required spectrum). As a light having a longer wavelength has a deeper penetrating capability (compared to a light having a shorter wavelength), we can make maximum use of incident light energy to improve the spatial resolution by disposing sensing pixels at different layers orthogonal or complementary to each other.
4. The present invention differs from Foveon company's X3 image sensors in that, each layer may comprise pixels sensing different colors, and the pixels may be at the same or different depths, while each layer of the X3 sensor comprises pixels sensing the same color at the same depth. In this way, more efficient use of sensing areas is achieved through a three-dimensional design. Moreover, the present invention works in a combination of the infrared and the visible light, which is different from the prior art.
5. The present invention arranges sensing pixels in the top layer and bottom layers such that the spectra sensed by the top and bottom layers are complementary (or at least orthogonal) to each other, thereby making maximum use of the energy of the incident light. In implementation, making them orthogonal instead of complementary can simplify the production process, or improve the spatial resolution.
6. If colors sensed by the upper and the lower layers are selected strictly according to a layer line, the colors sensed by the top layer are above the layer line and the colors sensed by the bottom layer are below the layer line. In this way, all the sensing pixels in the top layer may work at the same depth, and all the sensing pixels in the bottom layer may also be disposed at the same depth.
7. According to the present invention, the device may be manufactured by either using color filters or not. Because color filters absorb light energy and part of the absorbed light energy normally will be converted to thermal noise, the device of the invention is preferably produced without color filters, to maximally convert light into electronic signals.

Multi-spectrum sensing devices for sensing visible and infrared lights according to embodiments of the present invention will be discussed, which are exemplary only for demonstrating implementations and advantages thereof according to the present invention, but in no way to limit the scope of the invention.

For those skilled in the art, the above and other purposes as well as advantages of the present invention will be apparent with the detailed descriptions and illustrations of preferred embodiments with reference to the drawings as shown below.

BRIEF DESCRIPTION OF THE DRAWINGS

FIG. 1 is a diagram showing a CYMG color filter pattern.

FIGS. 2(a), 2(b), 2(c) and 2(d) are a diagram showing a Bayer pattern of RGB color filters and its variations.

FIGS. 11(a) and 11(b) describe one preferred embodiment of the single layer multi-spectrum sensing device according to the present invention and its variations, which senses the visible light and infrared simultaneously. The implementation in these figures uses a fourth layer line and adopts a diagonal pattern. The single layer multi-spectrum sensing device in these figures is a special case of the two-layer multi-spectrum sensing device.

FIGS. 12(a) and 12(b) illustrate one preferred embodiment of the two-layer multi-spectrum monochrome sensing device according to the present invention and its variations, which simultaneously senses the visible light and infrared, respectively. In these figures, a third layer line is used and the pixels therein are arranged in a rectangular and honeycomb pattern.

FIG. 16(b) uses a second layer line, the top layer comprising blank color, cyan and green.

DESCRIPTION OF EMBODIMENTS

A two-layer multi-spectrum color sensing device comprises a top layer and a bottom layer. The top layer comprises sensing pixels for sensing a first group of colors, the bottom layer comprises sensing pixels for sensing a second group of colors, and at least one of the top and bottom layers comprises sensing pixels for sensing at least two color spectra. The sensing device may be used to sense at least four continuous spectral bands containing a spectrum of red, a spectrum of green, a spectrum of blue and a spectrum of infrared. Herein, the infrared will also be called as a basis color. In many applications, the infrared may be neglected. In addition, the sensing device operates to sense composite color spectral bands, such as yellow (corresponding to red and green), cyan (corresponding to green and blue) and white (corresponding to red, green and blue).

Figure 6A:
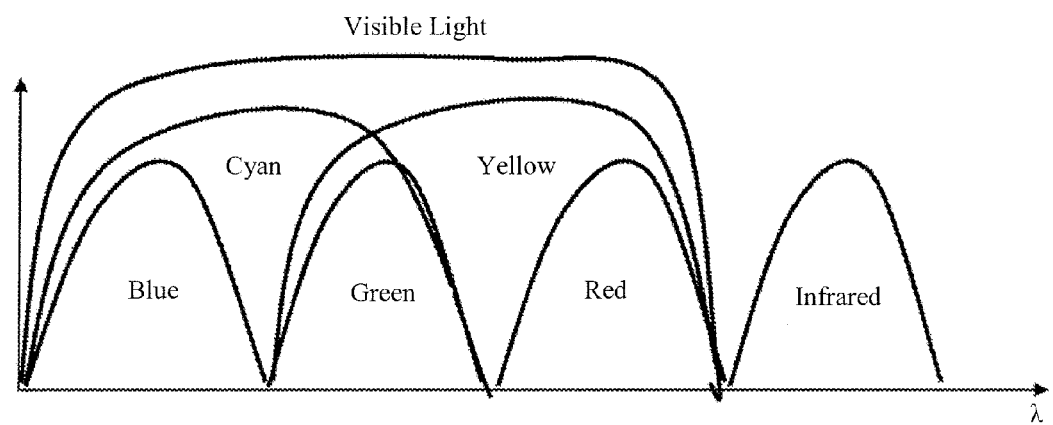
FIG. 6(a) is a diagram explaining the relationship between spectra of red, green, blue, yellow, cyan, white and infrared colors.
Figure 6B:
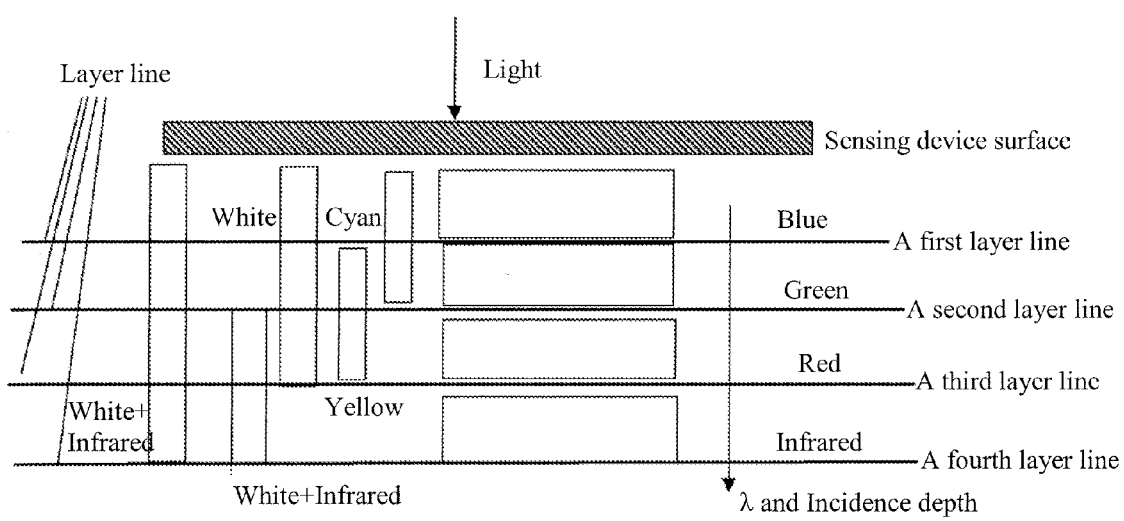
FIG. 6(b) is a diagram explaining the relationship between the incident depth and the wavelength of light in an opaque object, in which layer lines are used for simplifying the implementation of different sensing devices.
Figure 8A:
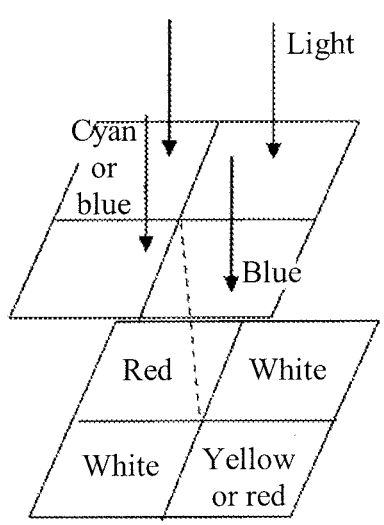
FIGS. 8(a)-8(d) describe one preferred embodiment of a two-layer color sensing device according to the present invention and its variations that use a generalized Bayer pattern, wherein FIG. 8(a) can lead to image sensing devices of CYMK colors.
Figure 8B:
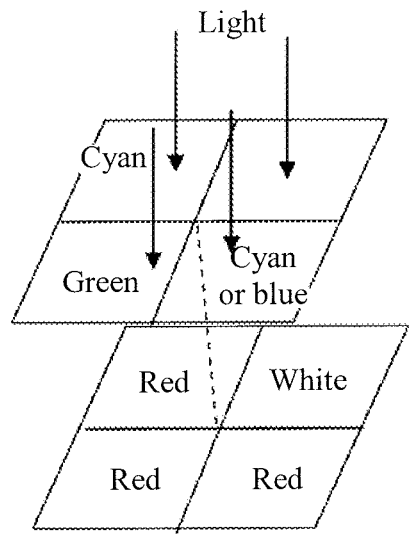
Figure 8C:
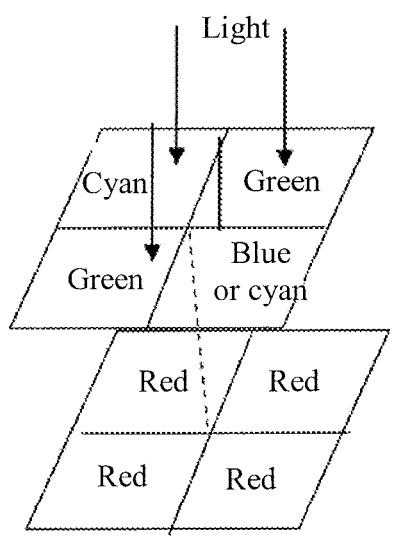
Figure 8D:
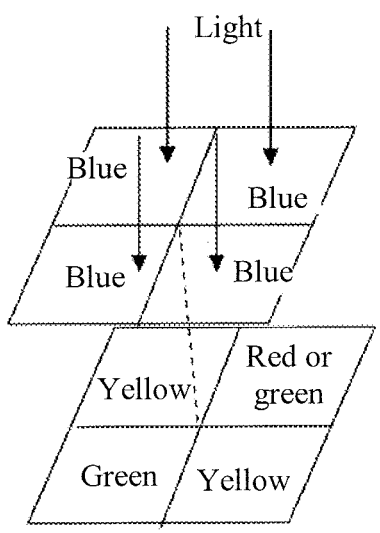
Figure 9A:
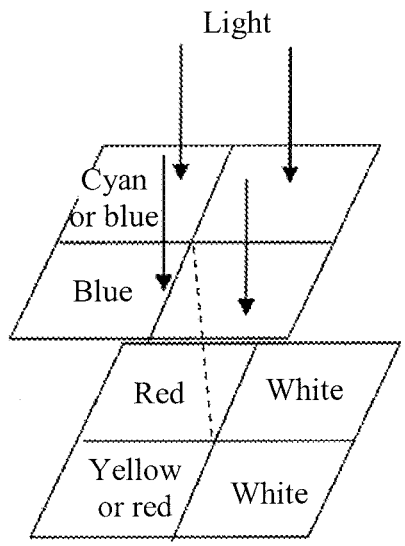
FIGS. 9(a)-9(d) describe another preferred embodiment of a two-layer color sensing device according to the present invention in YUV422 pattern and variations thereof.
Figure 9B:
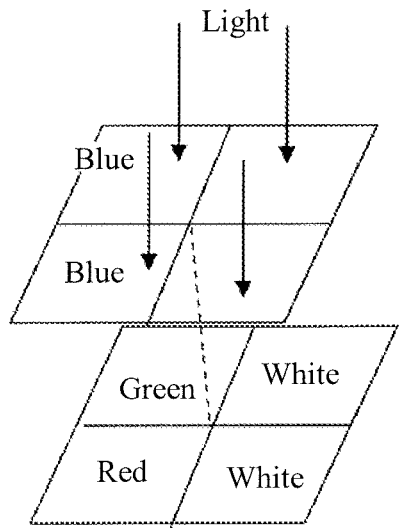
Figure 9C:
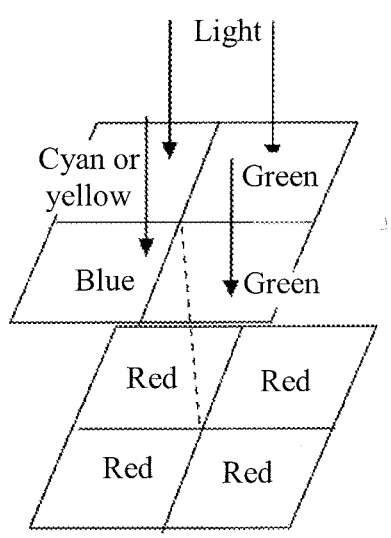
Figure 9D:
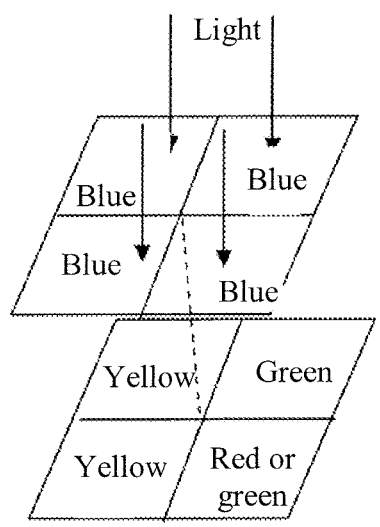
Figure 10A:
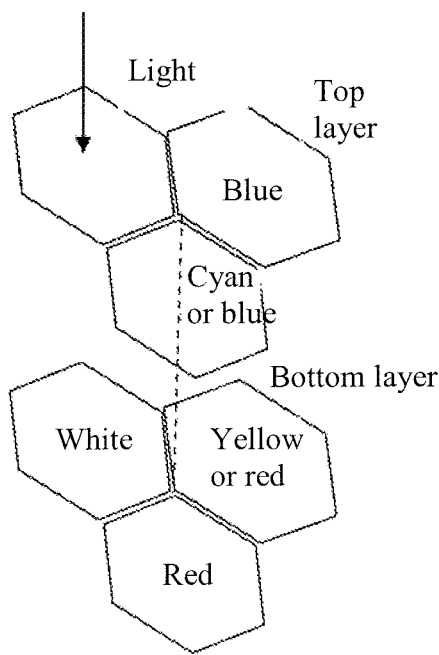
FIGS. 10(a)-10(d) describe another preferred embodiment of the two-layer color sensing device according to the present invention in a honeycomb pattern and variations thereof.
Figure 10B:
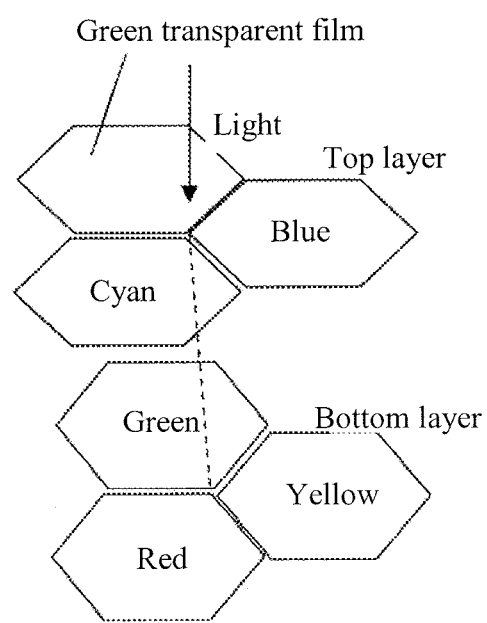
Figure 10C:
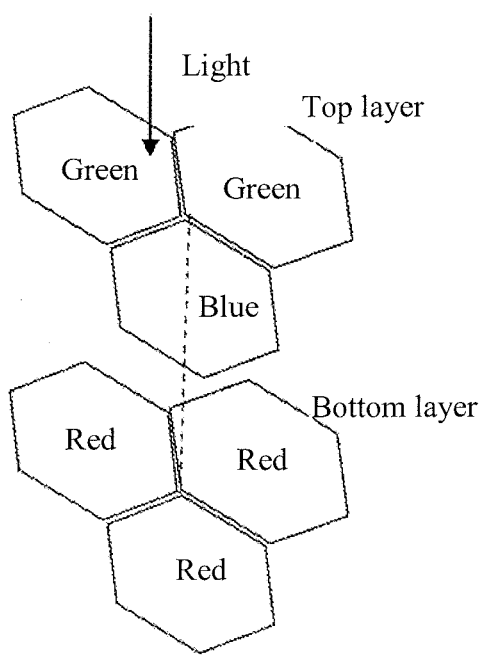
Figure 10D:
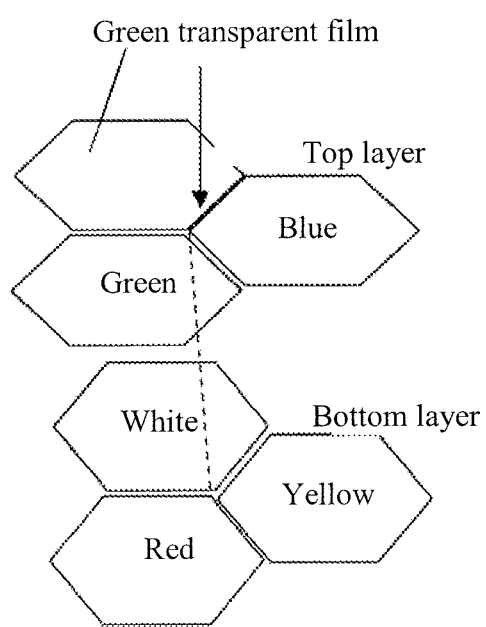

FIGS. 6(a) and 6(b) illustrate a relationship between spectra and colors of interest, wherein FIG. 6(a) illustrates wavelengths of different colors, and FIG. 6(b) illustrates the depth of incident lights with different wavelengths. There are four color layer lines shown in FIG. 6(b): a first layer line is a boundary between blue and green, a second layer line is a boundary between green and red, a third layer line is a boundary between red and infrared, and a fourth layer line is a boundary of the interested maximum wavelength of infrared. The sensing pixels of each layer may not have the same height or reside in the same depth. However, as shown in FIG. 6(b), if there are only colors above a certain layer line in the top layer and there are only colors below the certain layer line in the bottom layer, the sensing pixels at both the top and the bottom layer are able to be disposed at the same depth. The advantage of implementing the color sensing pixels in each layer at the same depth is the ease of manufacturing the sensing devices. As shown in FIG. 8(a), the wavelength of red in the bottom layer is longer than cyan or blue at the layers that are upper to the bottom layer, and the wavelength of yellow is longer than blue, whereas the sensing pixels sensing white reside in the bottom layer such that the top layer has to be hollow or transparent. With a common green spectrum, sensing pixels sending yellow and those sensing cyan cannot be disposed at the same position (at different layers).

Blank color (transparent or completely empty color) is implemented in the top layer (or a layer treated as the top layer). The panchromatic spectrum (white or white+infrared) is implemented in the bottom layer (or a layer treated as the bottom layer). Therefore, the blank color is always above a layer line, and the full color is always below a layer line.

For simplifying the description of the present invention, two terms are introduced herein: "complementary color" and "orthogonal color". To this purpose, we will also call blank color (transparent or completely empty color) as a basis color, which complements to with a full-color. The full-color in the present invention means white for the visible light spectra, and white plus infrared for the composite spectra of infrared and visible light.

Within a spectral space of interest (such as visible light spectra, composite spectra of visible light and infrared), if the two colors have no overlapped spectral bands, they are called orthogonal colors, e.g. red, green and blue colors are orthogonal to each other. In addition, blue is orthogonal to yellow, and cyan is orthogonal to red. Similarly, infrared is orthogonal to the entire visible light. That is, infrared is orthogonal to each of the colors of visible light, including primary colors, complementary colors, and white color (luminance intensity).

Within a spectral space of interest (such as visible light spectra, combined spectra of visible light and infrared), if the spectra of two orthogonal colors are added up to form the entire spectral space of interest, two orthogonal colors are called complementary colors. For example, for the visible light spectrum, cyan is complementary with red, and blue is complementary with yellow. Similarly, for the combined spectra of infrared and visible light, infrared is complementary with white, red plus infrared is complementary with cyan, and so on.

Figure 7A:
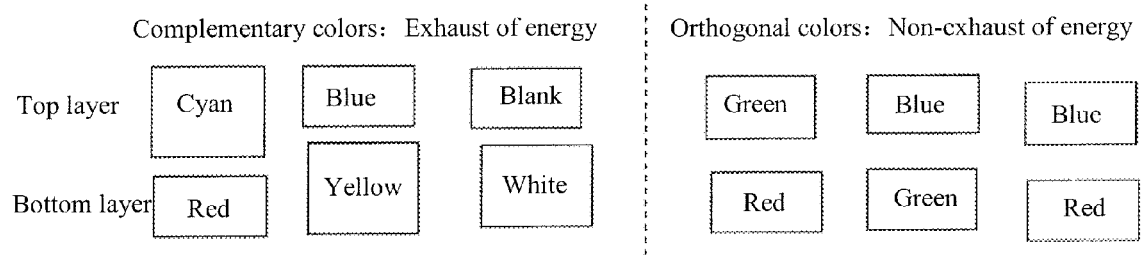
FIGS. 7(a) and 7(b) show examples of some orthogonal and complementary color pairs.
Figure 7B:
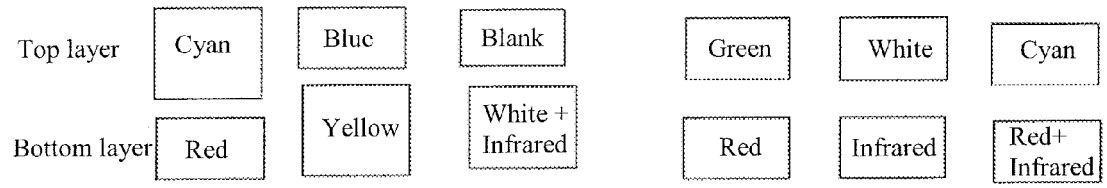

FIGS. 7(a) and 7(b) show examples of some orthogonal or complementary color pairs in the visible light space or in the composite spectral space of visible light and infrared, wherein FIG. 7(a) shows examples of the orthogonal and complementary color pairs in the spectral space of visible light, and FIG. 7(b) show examples of the orthogonal color pairs in the spectral space of infrared and visible light. These orthogonal or complementary color pairs are used in two-layer sensing devices.

Once a layer line is determined, colors sensed by sensing pixels in the top layer must be above the determined layer line, while colors sensed by the sensing pixels in the bottom layer must be orthogonal to, and, based on the principle of energy maximization, complementary with the colors at the corresponding positions in the top layer. All the colors sensed by the sensing pixels in the bottom layer do not have to lie below the layer line. However, if the colors sensed by the sensing pixels in the bottom layer are all below the layer line, the manufacture of the device will be much easier. Generally, each layer should not contain more than four distinct colors, in order to obtain higher spatial resolution.

Different sensing pixels in the same layer are arranged according to well-known patterns for attaining higher spatial resolutions. These patterns include, but are not limited to, generalized Bayer pattern (as shown in FIG. 8), YUV422 pattern (as shown in FIG. 9), and honeycomb pattern (as shown in FIG. 10).

Figures 4A, 4B, 4C, 5:
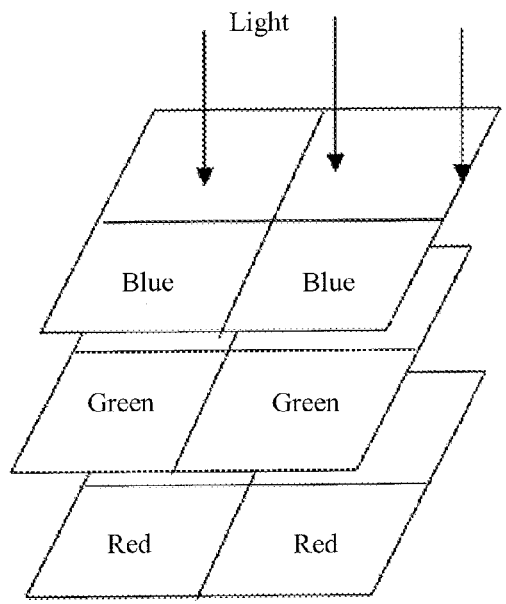
FIGS. 4(a) and 4(c) are the diagrams showing new Kodak color filter patterns that use white color.
FIG. 5 is a diagram explaining three layers color filters of Foveon's X3 image chip.

The present invention mostly concerns a sensing device in which pixels are ordered in rectangular or honeycomb patterns. The pixels in the rectangular pattern can be grouped into four-pixel macro-pixels, each of which consists of four pixels in a group, while the pixels in the honeycomb pattern can be decomposed into three-pixel macro-pixels, each of which consists of three pixels in a group. The macro-pixel is such a minimum pixel group that can be simply duplicated to form the entire pixel array, and normally consists of adjacent pixels. For rectangular patterns, the macro-pixel may comprise more than four pixels, e.g. new Kodak pattern as shown in FIG. 4, in which the macro-pixel comprises sixteen pixels. For the two-layer sensing device, the cost of the macro-pixel including more than four pixels is much higher, but with few advantages.

The four-pixel macro-pixel in a single layer may comprise one, two, three or four distinct colors. If a four-pixel macro-pixel comprises only one color, there is only one ordering pattern for the pixels, i.e. a uniform pattern. If a four-pixel macro-pixel comprises two distinct colors, there are three types of ordering patterns, i.e. a diagonal pattern (in which diagonal pixels have the same color), a vertical pattern (in which pixels on the same vertical line have the same color) and a horizontal pattern (in which pixels on the same horizontal line have the same color). If a four-pixel macro-pixel comprises three distinct colors, there are many options of the ordering patterns, all of which can be classified as the generalized Bayer order (in which the two same colors are aligned diagonally), the YUV422 order (in which the two same colors are aligned vertically), and the horizontal YUV422 order (in which the two same colors are aligned horizontally). If a four-pixel macro-pixel comprises four distinct colors, all of the ordering patterns for the pixels therein are uniformed, since the patterns are always symmetrical.

Figure 3A:
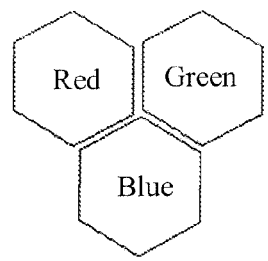
FIGS. 3(a) and 3(b) are the diagrams showing honeycomb patterns of the RGB color filters.
Figure 3B:
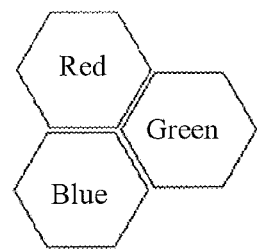

The three-pixel macro-pixel in a single layer may comprise one, two or three distinct colors, leading to a total of thirteen options. The honeycomb pattern itself may have two alignments, favoring either a vertical resolution (as shown in FIG. 3(a)) or a horizontal resolution (as shown in FIG. 3(b)). We shall refer all the patterns of the three-pixel macro-pixel as the honeycomb pattern, irrespective of how many colors the macro-pixel contains.

FIGS. 8(a)-8(d) show four preferred embodiments in Bayer patterns for the two-layer full spectra color sensing device, respectively, wherein the top layer selects three or fewer colors from blank color, blue, green and cyan, while the colors in the bottom layer are orthogonal to the colors at the corresponding position in the top layer. In the top layer, same color pixels are placed at the diagonal position, thereby forming the generalized Bayer pattern. Many other patterns are also possible. Those patterns not only guarantee a full color reconstruction but also approximately attain the highest spatial resolution and maximize the use of the incident light energy. In particular, the pattern as shown in FIG. 8(a) may be used to obtain a sensing device of CYMK colors, which has a much larger color representation gamut than the regular CMYK color sensors, with independent red and blue colors.

In the present and following embodiments, through strictly following such a rule that colors in the bottom layer must be complementary with colors in the top layer, the maximum use of the light energy may be achieved. In some embodiments, orthogonal colors are used instead of complement colors, and then the spatial resolution may be improved and the manufacture of the device may be much simpler.

FIGS. 9(a)-9(d) show four preferred embodiments of two-layer full spectra color sensing devices in YUV422 patterns, respectively. Similarly to FIG. 8, the same colors in top layer are aligned vertically so as to form YUV422 patterns. As shown in FIGS. 9(a)-9(d), the top layer comprises up to four colors selected from blank color, blue, green and cyan, while the colors in the bottom layer are orthogonal to the colors at the corresponding position in the top layer, respectively. Obviously, those skilled in the art can understand, many other variations are possible with simple modifications, if required.

FIGS. 10(a)-10(d) show four preferred embodiments of two-layer full spectra color sensing devices in honeycomb patterns, respectively. Except that the pixels are arranged in honeycomb pattern, the arrangements of pixels in FIGS. 10(a)-10(d) are similar to that as shown in FIG. 8(a). As honeycomb patterns may have vertical and horizontal alignments, many variations can be implemented. The top layer comprises one to three colors selected from blank color, blue, green and cyan, while the colors in the bottom layer are orthogonal to the colors at the corresponding position in the top layer, respectively.

When the top layer is empty and the bottom layer comprises just sensing pixels sensing only two spectra, the two-layer sensing device becomes a single layer sensing device. That is to say, the present invention includes a single layer sensing device as a special case of the two-layer sensing device, as shown in FIGS. 11(a) and 11(b).

FIGS. 11(a) and 11(b) show two preferred embodiments of the single layer monochrome multi-spectrum sensing device in which sensing pixels are arranged in diagonal patterns, which may be used to sense the visible light and infrared simultaneously. In this device, one type of the sensing pixel may be used to sense the visible light (white), and another type may be just used to senses infrared, or the full spectrum of the entire visible light and infrared. The pattern as shown in FIG. 11(a) is applicable to infrared cutting filters, which can be varied to have sensing pixels sensing white and infrared (or white+infrared) in YUV422 patterns.

FIGS. 12(a) and 12(b) show preferred embodiments of the two-layer multi-spectrum monochrome sensing device and variations thereof, which can sense the visible light and infrared simultaneously. FIG. 12(a) is in rectangular patterns, FIG. 12(b) is in honeycomb patterns, and both may sense the visible light and infrared simultaneously. The top layer senses white light or transparence, while the bottom layer senses the infrared or full spectrum (white+infrared).

Figure 13A:
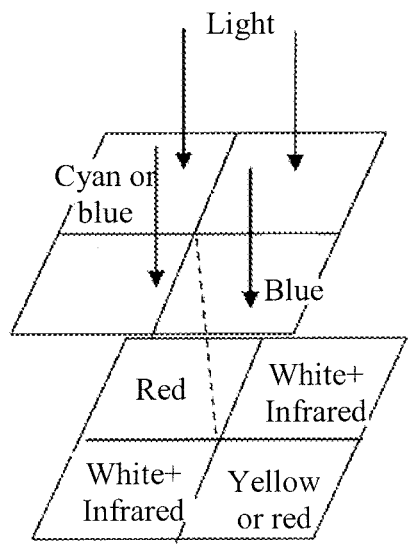
FIGS. 13(a) and 13(b) describe another preferred embodiment of the two-layer multi-spectrum color sensing device according to the present invention and its variations, which senses the visible light and infrared simultaneously. In these figures, a generalized Bayer pattern is used.
Figure 13B:
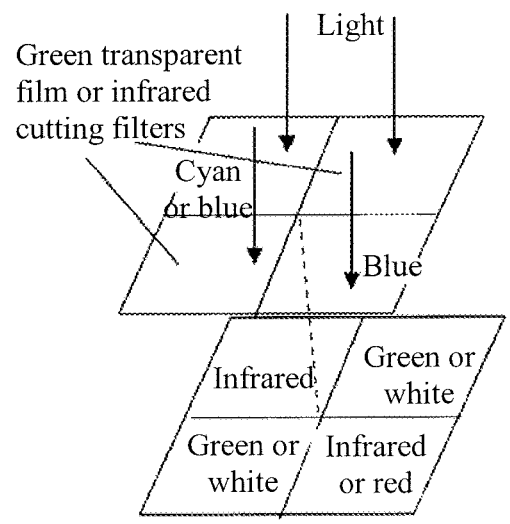

FIGS. 13(a) and 13(b) show preferred embodiments of the two-layer multi-spectrum color sensing device and variations thereof, which can sense the visible light and infrared simultaneously. The embodiments can have various structures, and FIGS. 13(a) and 13(b) are just two examples. In the figures, sensing pixels sensing infrared are always disposed in the bottom layer, which can be either alone or integrated with those sensing another color (e.g. white+infrared or red+infrared). The pixels sensing the same color are placed at the diagonal positions in order to obtain a higher spatial resolution. Similarly, the top layer comprises sensing pixels sensing one to four colors selected from blank color, blue, green and cyan, while the colors sensed by sensing pixels in the bottom layer are orthogonal or complementary to those sensed by sensing pixels disposed at the corresponding positions in the top layer, respectively.

Figure 14A:
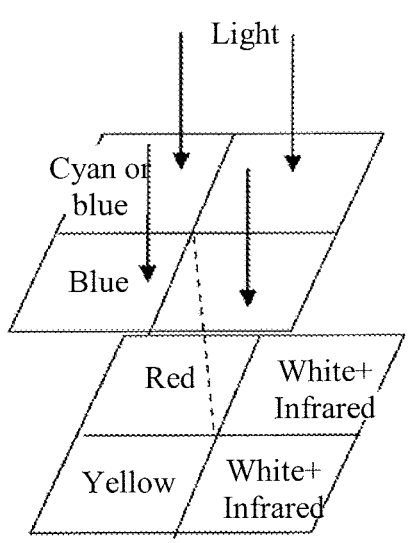
FIGS. 14(a) and 14(b) describe another preferred embodiment of the two-layer multi-spectrum color sensing device according to the present invention and its variations, which senses the visible light and infrared simultaneously. In these figures, YUV422 pattern is used.
Figure 14B:
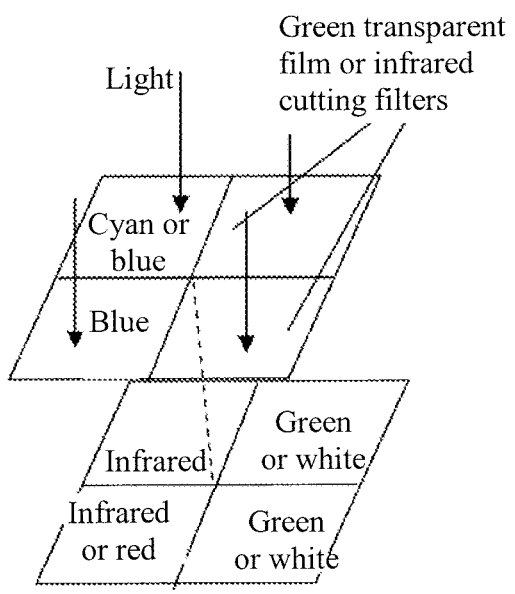

Another type of two-layer multi-spectrum color sensing device is shown in FIGS. 14(a) and 14(b), which can sense visible light and infrared simultaneously. In the device, infrared is always sensed in the bottom layer, which can be sensed either alone or together with another color (e.g. white+infrared or red+infrared). Sensing pixels sensing the same color are aligned vertically in order to form YUV422 pattern. Similarly, the top layer senses from one to four colors selected from blank color, blue, green and cyan, while colors sensed by the bottom layer are orthogonal or complementary to those sensed by pixels disposed at the corresponding positions in the top layer.

Figure 15A:
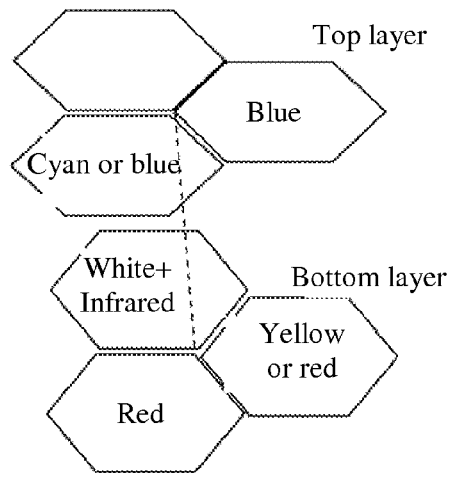
FIGS. 15(a) and 15(a) describe another preferred embodiment of the two-layer multi-spectrum color sensing device according to the present invention and its variations, which senses the visible light and infrared simultaneously. In these figures, honeycomb pattern is used.
Figure 15B:
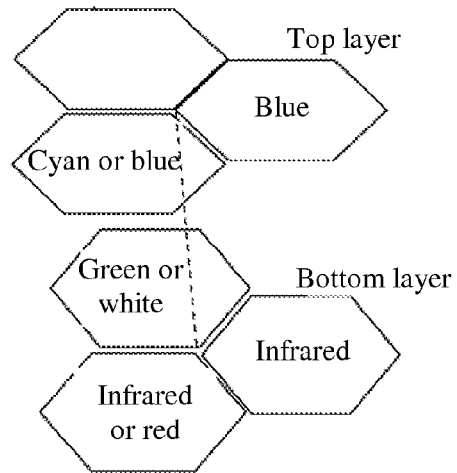

Another type of two-layer multi-spectrum color sensing device is shown in FIGS. 15(a) and 15(b), which adopts honeycomb pattern and may be utilized to sense the visible light and infrared simultaneously. In this type of device, infrared is always sensed in the bottom layer, which can be sensed either alone or together with another color (e.g. white+infrared or red+infrared). Similarly, the top layer senses from one to three colors selected from blank color, blue, green and cyan, while colors sensed in the bottom layer are orthogonal or complementary to those sensed by pixels at the corresponding positions in the top layer.

Figure 16A:
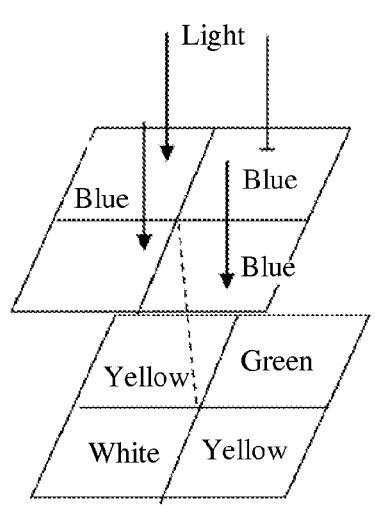
FIGS. 16(a) and 16(b) describe another preferred embodiment of the two-layer multi-spectrum color sensing device according to the present invention and its variations, which uses layer lines and senses the visible light and infrared simultaneously, in which FIG. 16(a) uses a first layer line, the top layer comprising only blue and blank colors.
Figure 16B:
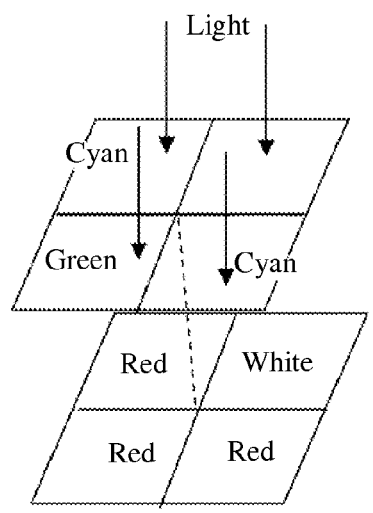

Yet another type of two-layer multi-spectrum color sensing device that strictly uses layer lines is shown in FIGS. 16(a) and 16(b). FIG. 16(a) adopts a first layer line and FIG. 16(b) adopts a second layer line. In the embodiments, although white color comprises a spectral band above the layer line, white color can be implemented in the bottom layer since the corresponding color in the top layer is blank or transparent, as mentioned previously. Sensing pixels that are layered strictly according to the layer line (through color filters) have the advantages that they can be disposed at the same depth and that a layer can have the same thickness. There are many methods for layering sensing pixels according to the layer line.

Hereinafter, referring to FIG. 8(a), is given an example of a method for manufacturing the full spectrum color sensing device according to the present invention.

1. A top layer and a bottom layer are provided, respectively. At the top layer are disposed sensing pixels sensing a first group of colors: blue, cyan, and blank color (namely transparence), and at the bottom layer are disposed sensing pixels sensing a second group of colors: yellow, red and white.
2. The sensing pixels are disposed at the bottom layer and top layer such that the wavelength of a color sensed in the bottom layer is longer than that of colors sensed by the sensing pixels at the corresponding position in the top layer, and the spectrum of the colors sensed in the bottom layer is orthogonal or complementary to the total spectrum of the colors sensed by the pixels at the corresponding position in the top layer within the spectral space of visible light. Specifically, as shown in FIG. 8(a), when color sensed in the top layer is blue, color sensed at the corresponding position in the bottom layer may be yellow or red; when color sensed in the top layer is cyan or blue, color sensed at the corresponding position in the bottom layer may be red; when color sensed in the top layer is blank, color sensed at the corresponding position in the bottom layer may be any color, but white color can render the incident light energy maximally used.

Those skilled in the art may understand that methods for manufacturing full spectrum color sensing devices as illustrated in other figures are identical or similar to the above, which are not described herein.

Those skilled in the art may also understand that, through varying the ordering of pixels in the top layer and bottom layer, various implementations different from the above preferred embodiments will be easily obtained. For example, if needed, those skilled in the art can appreciate that middle layers can also be provided according to the principle of maximizing the use of the incident light energy or obtaining the highest spatial resolution. The wavelength of each color sensed in a lower layer is required to be longer than that of colors sensed at the corresponding position in an upper layer; and the spectrum of each color sensed in the lower layer to be orthogonal to the total spectrum of colors at the corresponding position in all upper layers within the spectral space of visible light. The spectrum of each color sensed in the bottom layer is orthogonal to that of colors sensed at the corresponding position in all upper layers within the spectral space of visible light or a combined space of visible light and infrared. Preferably, the spectrum of each color sensed in the lower layer should be complementary to the total spectrum of colors sensed at the corresponding position in all upper layers within the spectral space of visible light.

In conclusion, the spirit of the present invention is to make maximum use of energy of incident light, or to maximize a spatial resolution, or to obtain a larger color representation gamut at a low cost, through delicately ordering and configuring sensing pixels at a single-, two- or multi-layer in color sensing devices. Although the present invention is disclosed through the preferred embodiments, such disclosure should not be considered limitations to the invention. For artisan in the image sensing devices (such as semiconductor image sensor chips), upon the disclosure, it is possible to anticipate many variations and extensions of the present invention, without departing from the spirit and concept of the invention.

What is claimed is:

1. A multi-spectrum sensing device, comprising at least one top layer and one bottom layer, wherein said top layer comprises sensing pixels for sensing a first group of colors, said bottom layer comprises sensing pixels for sensing a second group of colors, and at least one of the top and bottom layers comprises sensing pixels for sensing at least two or more spectra, wherein:
   a lower layer senses a color having a wavelength longer than the wavelength of a color sensed at a corresponding position in a layer upper to the lower layer, and
   a spectrum of a color sensed in a lower layer is orthogonal to total spectra of colors sensed at corresponding positions in all layers upper to the lower layer within a spectral space of visible light, and wherein a spectrum of each of colors sensed in the bottom layer is orthogonal to the total spectrum of a color sensed at a corresponding position in all layers upper to the bottom layer either within a spectral space of visible light or a composite spectral space of visible light and infrared light.

2. The device of claim 1, wherein the device consists of one top layer and one bottom layer.

3. The device of claim 1, wherein each of said spectra comprises a combination of the spectrum of blue, green, red and infrared.

4. The device of claim 1, wherein said first group of colors comprise one of the following:
   A. at most four kinds of colors selected from blank, color, blue, green and cyan;
   B. blank color or blue;
   C. blank color, blue and cyan;
   D. blank color, blue and green;
   E. blank color, green and cyan; and
   F. blank color, blue, green and cyan.

5. The device of claim 1, wherein the spectrum of a color sensed in the lower layer is complementary to the total spectra of colors sensed at corresponding positions in all layers upper to the lower layer within a spectral space of visible light.

6. The device of claim 1, wherein the second group of colors comprise at most four kinds of colors selected from the color group consisting of green, red, yellow, white, infrared, red plus infrared, yellow plus infrared, and white plus infrared.

7. The device of claim 1, wherein the sensing pixels are arranged in a pattern selected from the pattern group consisting of a uniform pattern, a horizontal pattern, a vertical pattern, a diagonal pattern, a generalized Bayer pattern, a YUV422 pattern, a horizontal YUV422 pattern, a honeycomb pattern and an equal spacing pattern.

8. The device of claim 2, wherein the top layer comprises a first group of sensing pixels for sensing intensity of visible light (white), and the bottom layer comprises a second group of sensing pixels for sensing intensity of visible light and infrared light (white plus infrared).

9. A method for manufacturing a multi-spectrum sensing device, comprising providing at least one top layer and one bottom layer, wherein:

the top layer comprises sensing pixels for sensing a first group of colors, the bottom layer comprises sensing pixels for sensing a second group of colors, and at least one layer comprises sensing pixels for sensing at least two or more spectra, a spectrum of a color sensed in a lower layer orthogonal to the total spectra of colors sensed at corresponding positions in all layers upper to the lower layer within a spectral space of visible light, and a spectrum of a color sensed in the bottom layer is orthogonal to the total spectrum of a color sensed at corresponding positions in all layers upper to the bottom layer either within a spectral space of visible light or a composite spectral space of visible light and infrared light.

10. The method of claim 9, wherein only one top layer and one bottom layer are provided without middle layers.

11. The method of claim 9, wherein the spectra comprise a spectrum of blue, a spectrum of green, a spectrum of red and a spectrum of infrared.

12. The method of claim 9, wherein the first group of colors comprise one of the following:

A. at most four kinds of colors selected from blank color, blue, green and cyan;
B. blank color or blue;
C. blank color, blue and cyan;
D. blank color, blue and green;
E. blank color, green and cyan; and
F. blank color, blue, green and cyan.

13. The method of claim 9, wherein a lower layer senses a color having a wavelength longer than the wavelength of a color sensed at a corresponding position in a layer upper to the lower layer.

14. The method of claim 9, wherein a spectrum of a color sensed in a lower layer is complementary to total spectra of colors sensed at corresponding positions in all layers upper to the lower layer within a color space of visible light, and a spectrum of a color sensed in the bottom layer is complementary to the total spectrum of colors sensed at corresponding positions in all layers upper to the bottom layer within a spectral space of visible light or a composite spectral space of visible light and infrared light.

15. The method of claim 9, further comprising: providing a layer line for delaminating the sensing pixels such that all colors in an upper layer are above the layer line and all colors in a lower layer are below the layer line.

16. The method of claim 15, wherein the layer line is a color separation line between blue and green, or between green and red, or between red and infrared, or a boundary line of the maximum interested wavelength of infrared light.

17. The method of claim 9, wherein only one layer comprises sensing pixels that sense two spectra and are placed in a horizontal pattern, a vertical pattern or a diagonal pattern; and the other layers are blank or comprise no sensing pixels.

* * * * *